(12) United States Patent
Hu

(10) Patent No.: US 7,101,747 B2
(45) Date of Patent: Sep. 5, 2006

(54) DUAL WORK FUNCTION METAL GATES AND METHODS OF FORMING

(75) Inventor: Yongjun J. Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/180,288

(22) Filed: Jul. 13, 2005

(65) Prior Publication Data

US 2005/0250275 A1    Nov. 10, 2005

Related U.S. Application Data

(62) Division of application No. 10/463,142, filed on Jun. 17, 2003, now abandoned.

(51) Int. Cl.
    *H01L 21/8238*    (2006.01)

(52) U.S. Cl. .................. 438/199; 438/217; 438/648; 438/649

(58) Field of Classification Search ........ 438/199–217, 438/648–651, 683–686
See application file for complete search history.

(56) References Cited

U.S. PATENT DOCUMENTS

| 4,974,056 A | 11/1990 | Brodsky et al. ............. 257/751 |
| 6,027,961 A | 2/2000 | Maiti et al. .................. 438/199 |
| 6,501,131 B1 | 12/2002 | Divakaruni et al. ........ 257/344 |
| 2002/0096724 A1 | 7/2002 | Liang et al. ................. 257/369 |
| 2003/0109121 A1* | 6/2003 | Rotondaro ................... 438/592 |

OTHER PUBLICATIONS

"Electrical Characteristics of TASIXNY/SIO2/SI Structures by Fowler-Nordheim Current Analysis", Suh et al., Applied Physics Letters, vol. 80, No. 8, Feb. 25, 2002, pp. 1403-1405.

* cited by examiner

*Primary Examiner*—H. Jey Tsai
(74) *Attorney, Agent, or Firm*—David J. Paul

(57) ABSTRACT

Complementary transistors and methods of forming the complementary transistors on a semiconductor assembly are described. The transistors can be formed from a metal silicon compound deficient of silicon bonding atoms on a dielectric material overlying a semiconductor substrate conductively doped for PMOS and NMOS regions. The metal silicon compound overlying the NMOS region is converted to a metal silicon nitride and the metal silicon compound overlying the PMOS region is converted to a metal silicide. NMOS transistor gate electrodes comprising metal silicon nitride and PMOS transistor gate electrodes comprising metal silicide can be formed.

56 Claims, 7 Drawing Sheets

US 7,101,747 B2

DUAL WORK FUNCTION METAL GATES AND METHODS OF FORMING

This application is a divisional to U.S. patent application Ser. No. 10/463,142, filed Jun. 17, 2003 now abandoned.

FIELD OF THE INVENTION

This invention relates to semiconductor devices and fabrication processes thereof. The invention particularly relates to complementary transistors having dual work function transistor gate electrodes and methods to fabricate same.

BACKGROUND OF THE INVENTION

Complementary Metal Oxide Semiconductor (CMOS) devices are dominated by n-channel (NMOS) and p-channel (PMOS) transistor structures. Various physical characteristics of each type of transistor determine the threshold voltage ($V_t$) that must be overcome to invert the channel region and cause a given transistor to conduct majority carriers (either by electrons movement in an NMOS device or by hole movement in a PMOS device).

One of the controlling physical characteristics is the work function of the material used to form the gate electrode of the transistor device. In semiconductor devices, such as a Dynamic Random Access Memory (DRAM) device, the transistor gates are predominantly made of polysilicon and an overlying layer of tungsten silicide. However, polysilicon transistor gates are prone to polysilicon depletion effects such as unwanted voltage drops that reduce transistor performance.

Metal gate technology presents an alternate approach for CMOS transistor devices in that the traditional polysilicon gate electrodes are replaced with metal or metal alloy electrodes. In order to substitute the traditional p-type or n-type polysilicon transistor gate with a metal or metal compound it is desirable to use metals that have similar work function characteristics in order to obtain a comparable transistor threshold voltage. N-type doped silicon has a work function of approximately 4.15 electron-volts (eV). Metals having a similar work function include aluminum (Al), manganese (Mn), zirconium (Zr), niobium (Nb), hafnium (Hf), and tantalum (Ta). P-type doped silicon has a work function of approximately 5.2 eV. Metals having a similar work function include nickel (Ni), cobalt (Co), platinum (Pt) and ruthenium (Ru).

Currently, in the semiconductor fabrication, there is a need for a metal that can be used to form both the gates of both n-channel and p-channel transistors in semiconductor devices, a need of which is addressed by the following disclosure of the present invention that will become apparent to those skilled in the art.

SUMMARY OF THE INVENTION

Exemplary implementations of the present invention include complementary transistors and methods of forming the complementary transistors on a semiconductor assembly by forming a metal silicon compound deficient of silicon bonding atoms on a dielectric material overlying a semiconductor substrate conductively doped for PMOS and NMOS regions, converting the metal silicon compound overlying the NMOS region to a metal silicon nitride by introducing nitrogen ions thereto while the metal silicon compound overlying the PMOS region is unexposed, converting the metal silicon compound overlying the PMOS region to a metal silicide by introducing silicon thereto during an annealing step while the metal silicon compound overlying the NMOS region is unexposed, forming an NMOS transistor gate electrode comprising metal silicon nitride and forming a PMOS transistor gate electrode comprising metal silicide.

DETAILED DESCRIPTION OF THE INVENTION

The following exemplary implementations are in reference to the complementary transistors and the formation thereof. While the concepts of the present invention are conducive to transistor structures for semiconductor memory devices, the concepts taught herein may be applied to other semiconductor devices that would likewise benefit from the use of the process disclosed herein. Therefore, the depictions of the present invention in reference to transistor structures for semiconductor memory devices are not meant to so limit the extent to which one skilled in the art may apply the concepts taught hereinafter.

In the following description, the terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-saphire, germanium, or gallium arsenide, among others.

Figure 1:
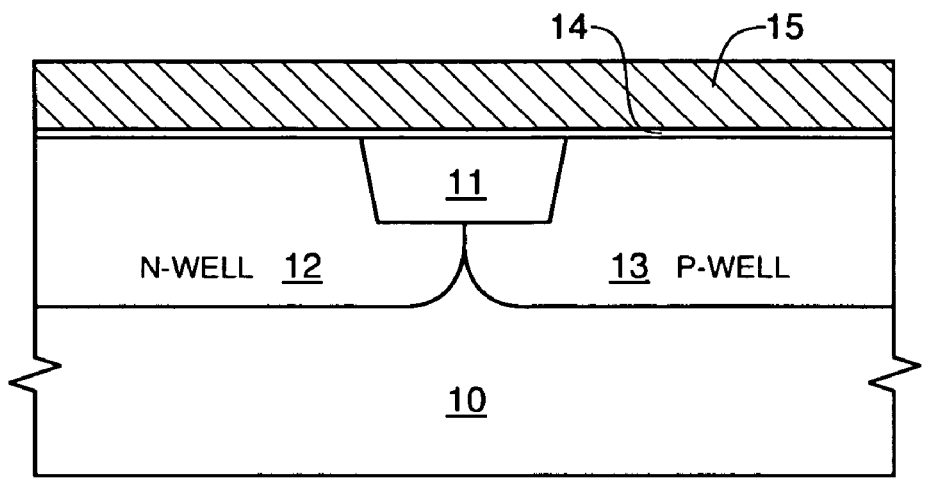
FIG. 1 is a cross-sectional view of a semiconductor substrate section showing the early stages of an semiconductor assembly having NWell and PWell regions formed in a silicon substrate partially separated by an isolation material, a gate dielectric layer formed over the Well regions and a tantalum silicon ($TaSi_x$) layer formed on the gate dielectric layer, according to one embodiment of the present invention.

A first exemplary implementation of the present invention is depicted in FIGS. 1-6. Referring now to FIG. 1, substrate 10, is processed to the point where NWell region 12 and PWell region 13 are formed in substrate 10. Isolation material 11 partially separates and electrically isolates the upper portions of the Well regions from one another. Dielectric material 14 is deposited over the surfaces of NWell region 12, PWell region 13 and isolation material 11.

Next, a film that is a metal silicon compound deficient of silicon bonding atoms in the form of $MSi_x$, where M=Ta, Hf, Mo or W and x<2, is deposited for example by Physical Vapor Deposition (PVD), by Chemical Vapor Deposition (CVD), or by Atom Layer Deposition (ALD). It is preferred that the value of "x" is in the range of $0.4 \leq x \leq 1.0$ and it is further preferred that the material deposited is $TaSi_x$, such as $TaSi_{0.6}$.

Using $TaSi_{0.6}$ as a preferred material, a $TaSi_{0.6}$ layer 15 is formed on dielectric material 14. The NWell and PWell regions can be formed either before or after the formation of gate dielectric layer 14 and $TaSi_{0.6}$ layer 15. The $TaSi_{0.6}$ layer is deposited from a $TaSi_{0.6}$ source by methods know to those skilled in the art. Dielectric material 14 will eventually serve as the gate dielectric for the subsequently formed transistor structures and is preferably a dielectric material possessing a high dielectric constant of at least seven or more, such as nitride or metal oxides (i.e., $Al_2O_3$, $SiO_2/Al_2O_3$ and $Al_2O_3/HfO_x$) so the gate dielectric layer remains significantly th However, a material having a lower dielectric constant (around 3.8), such as silicon dioxide, may be used. The thickness of the silicon dioxide layer would have to be scaled in thickness in order to provide proper gate to channel separation.

Figure 2:
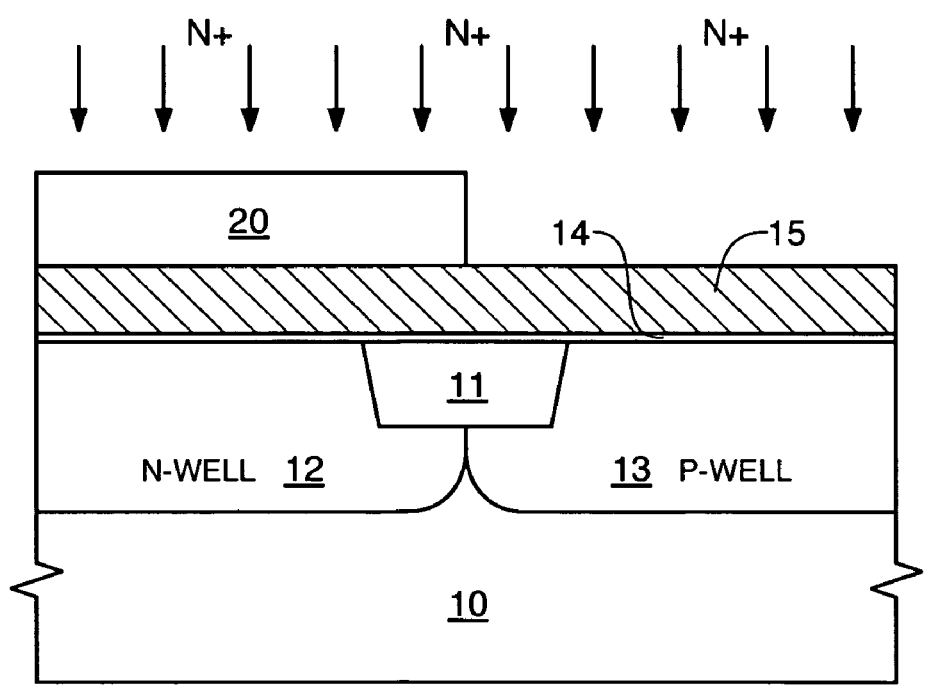
FIG. 2 is a subsequent cross-sectional view taken from FIG. 1 following the masking of a portion of the $TaSi_x$ layer, followed by the implantation of nitrogen ions into the $TaSi_x$ layer to convert that layer to tantalum silicon nitride (TaSiN).

Referring now to FIG. 2, a mask material 20, such as photoresist, is patterned to cover the portion of the $TaSi_{0.6}$ layer 15 that overlies NWell region 12. Next, nitrogen ions ($N^+$) are presented to (i.e., implanted) the uncovered portion of $TaSi_{0.6}$ layer 15 to covert that portion of $TaSi_{0.6}$ to tantalum silicon nitride (TaSiN) 30 as seen in FIG. 3.

Figure 3:
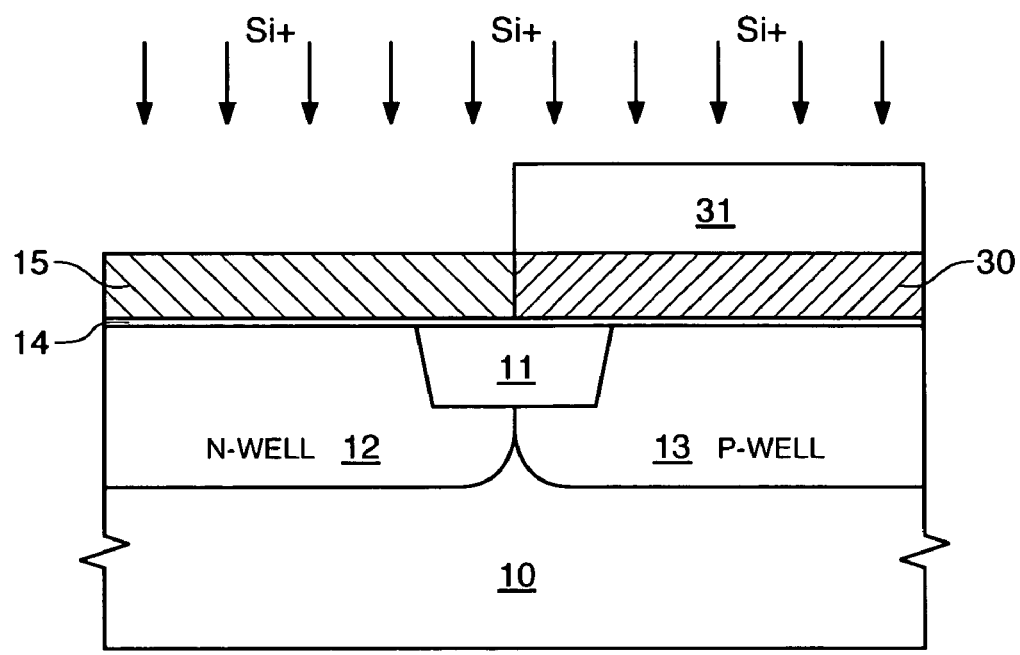
FIG. 3 is a subsequent cross-sectional view taken from FIG. 2 following the removal of the mask in FIG. 2 and the masking of the TaSiN portion, followed by the implantation of silicon ions during an anneal to transform the exposed $TaSi_x$ layer to tantalum disilicide ($TaSi_2$).
Figure 4:
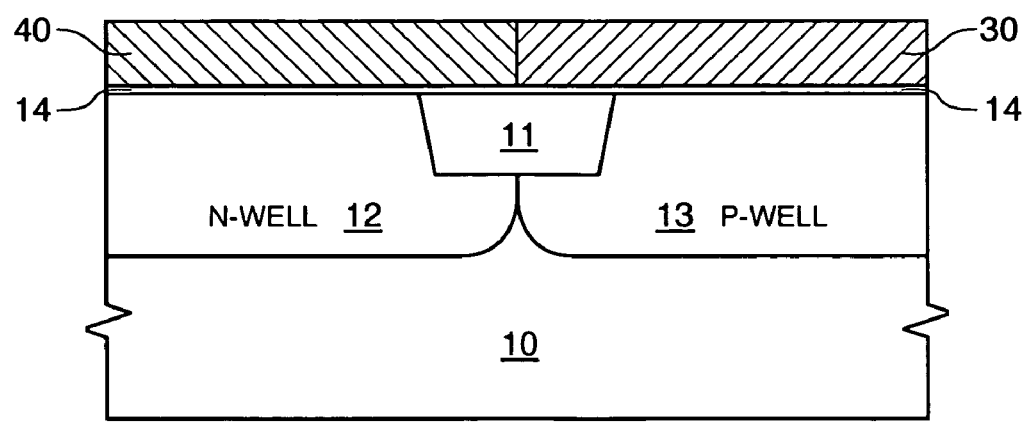
FIG. 4 is a subsequent cross-sectional view taken from FIG. 3 following removal of the mask in FIG. 3, which shows the $TaSi_2$ and TaSiN materials adjacent one another.

Referring now to FIG. 3, a mask material 31, such as photoresist, is patterned to cover the portion of the $TaSi_{0.6}$ layer 15 that overlies PWell region 13. Next, silicon ions ($Si^+$) are presented to (i.e., implanted) the uncovered portion of $TaSi_{0.6}$ layer 15, followed by rapid thermal processing (RTP) of approximately 600° C. for approximately 30 seconds, to covert that portion of $TaSi_{0.6}$ layer 15 to tantalum disilicide ($TaSi_2$) 40 as seen in FIG. 4. The low RTP temperature of 600° C. is sufficient to form fully crystallized $TaSi_2$, which is well below 800° C., a temperature at which the nitrogen would begin to significantly denude out of the TaSiN. The RTP step of 600° C. for 30 seconds is preferred, however, the RTP temperature could range from 550° C. to 800° C. and the duration could range from 20 seconds to 30 minutes. (The RTP processing may be, in general, considered as an annealing step.)

Referring now to FIG. 4, $TaSi_2$ 40 and TaSiN 30 are shown adjacent one another and overlying NWell 11 and PWell 12, respectively. As now evident in FIG. 4, the presence of the original $TaSi_{0.6}$ layer is a key step in providing a method to convert this material into two separate materials, namely $TaSi_2$ and TaSiN, by the separate masking and implantation steps discussed in FIGS. 2 and 3.

Figure 5:
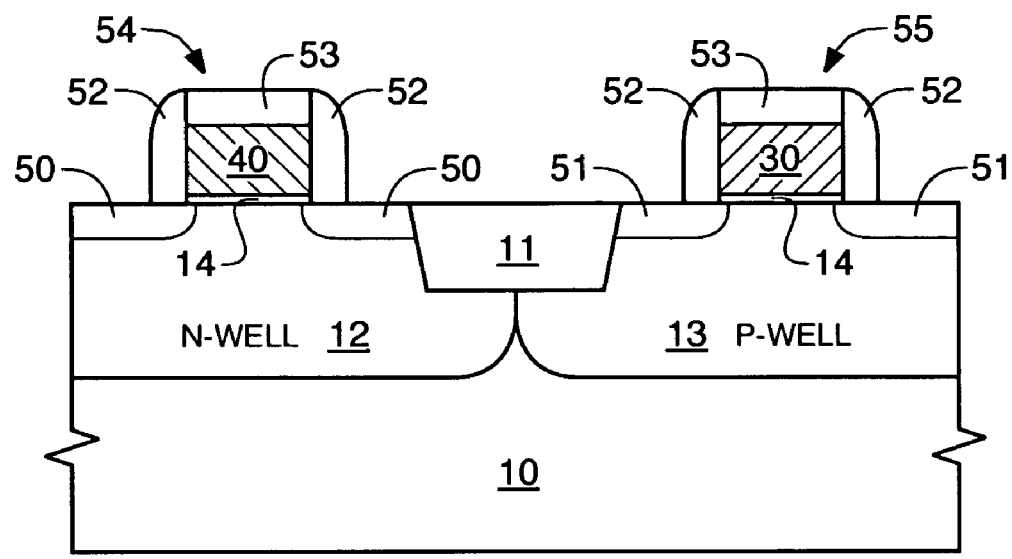
FIG. 5 is a subsequent cross-sectional view taken from FIG. 4 following the completion of a complementary transistor pair having transistor gates that possess differing work function values.

Referring now to FIG. 5, a complementary pair of completed transistor structures having dual work function gates is depicted. Both transistors are formed using conventional fabrication techniques to pattern and etch each transistor gate, followed by implanting the source and drain regions 50 to a p-type conductivity to form a p-channel transistor and implanting the source drain regions 51 to an n-type conductivity to form an n-channel transistor. Completed transistor gate 54 comprises insulation (such as nitride) spacers 52 and cap 53 that provide physical isolation for $TaSi_2$ gate 40. In like manner, completed transistor gate 55 comprises insulation (such as nitride) spacers 52 and insulation cap 53 that provide physical isolation for TaSiN gate 30. The gate material for each transistor exhibits a differing work function as the $TaSi_2$ gate will have a work function of 4.8 eV, while TaSiN gate will have a work function of 4.2 eV to 4.3 eV.

Figure 6:
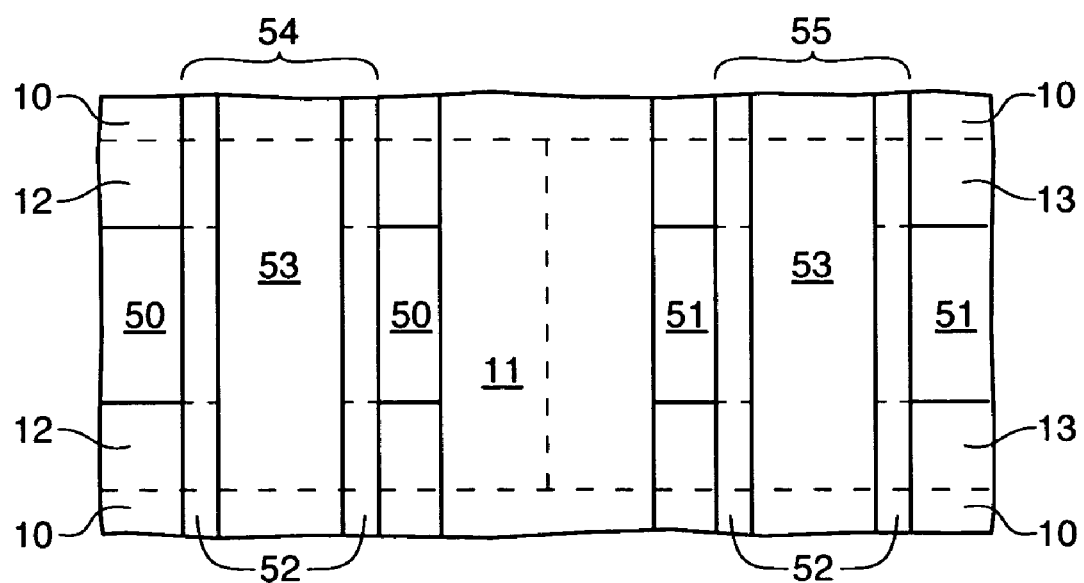
FIG. 6 is an overhead plan view of FIG. 5 showing a completed complementary transistor pair of first embodiment of the present invention.

FIG. 6 depicts an overhead view of a completed complementary pair of transistor structures having dual work function gates as described in the process steps taken in FIG. 1-5. As shown in FIG. 6, substrate 10 has been implanted with conductive dopants to form NWell 11 and PWell 12. Completed transistor gate 54 comprises insulation spacers 52 and cap 53 that provide physical isolation for $TaSi_2$ gate 40 (not seen). In like manner, completed transistor gate 55 comprises insulation spacers 52 and insulation cap 53 that provide physical isolation for TaSiN gate 30 (not seen). The source and drain regions 50 are implanted with a p-type conductivity to form a p-channel transistor and the source drain regions 51 are implanted with to an n-type conductivity to form an n-channel transistor.

Figure 7:
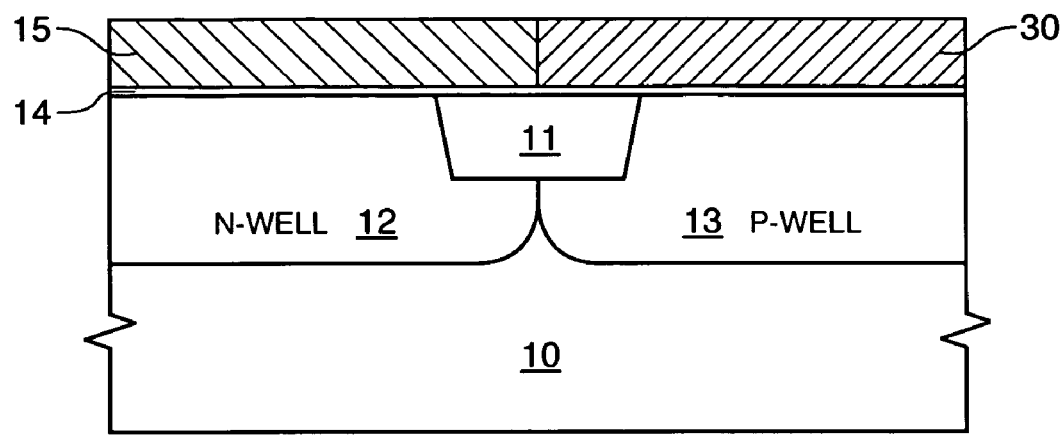
FIG. 7 is a subsequent cross-sectional view following the process steps depicted in FIGS. 1 and 2 showing a $TaSi_x$ portion adjacent to a TaSiN portion.

A second exemplary implementation of the present invention is depicted in FIGS. 1–2 and 7-11. Referring now to FIG. 7, process steps, as taught for FIGS. 1 and 2, are performed to create $TaSi_{0.6}$ portion 15 and TaSiN portion 30 on dielectric material 14 overlying NWell region 12 and PWell region 13, respectively. The process steps of FIGS. 1 and 2 are not repeated to avoid redundant disclosure.

Figure 8:
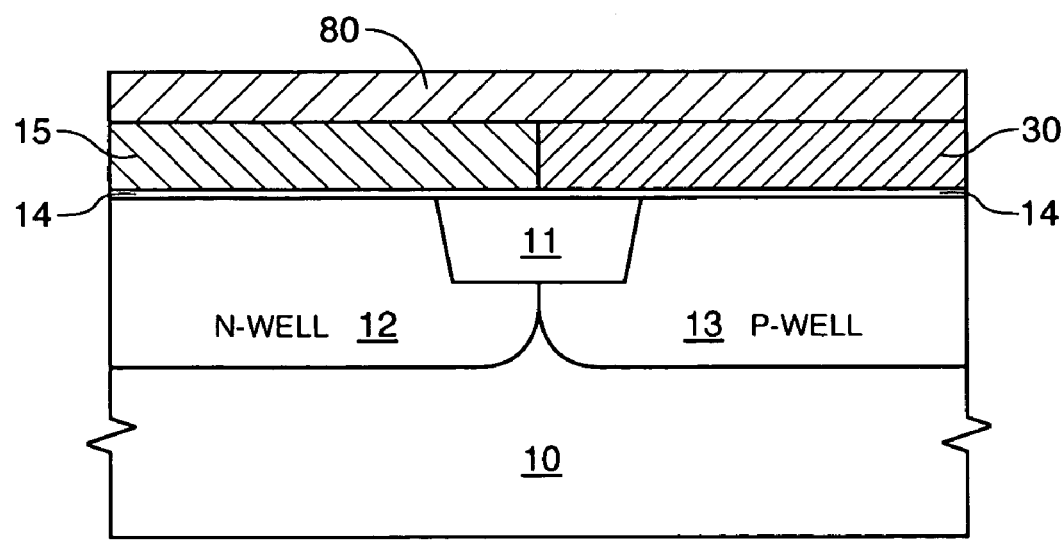
FIG. 8 is a subsequent cross-sectional view taken from FIG. 6 following the formation of a silicon layer on the $TaSi_x$ and TaSiN portions.

Referring now to FIG. 8, a polysilicon layer 80 is deposited directly on $TaSi_{0.6}$ portion 15 and TaSiN portion 30. Polysilicon layer 80 will provide a source of silicon atoms for a subsequent material conversion step.

Figure 9:
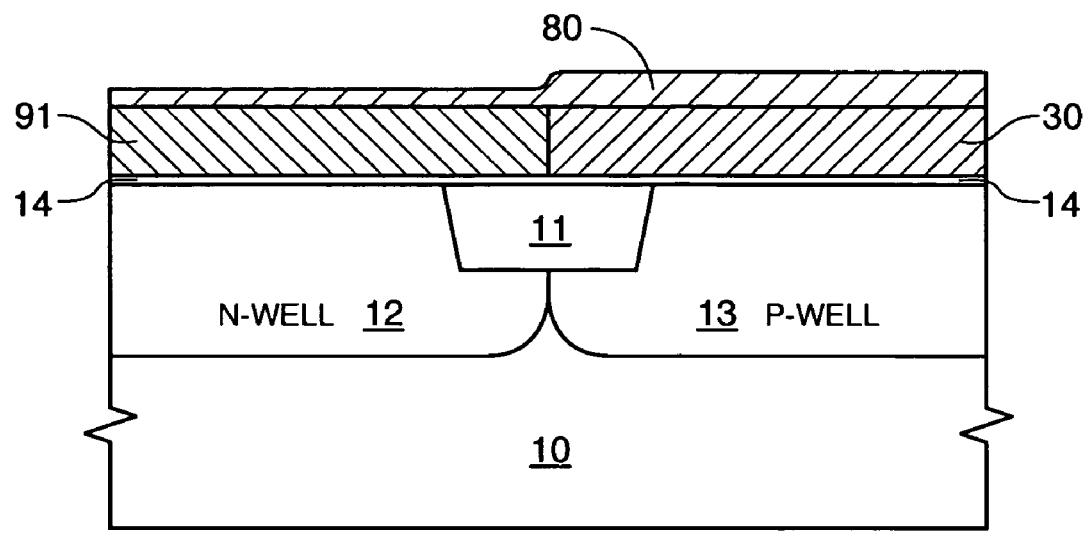
FIG. 9 is a subsequent cross-sectional view taken from FIG. 7 following an anneal step to convert the $TaSi_x$ portion in to $TaSi_2$.

Referring now to FIG. 9, the semiconductor assembly is subjected to a rapid thermal anneal (in one embodiment at a temperature of 650° C. for 30 seconds), which causes silicon atoms to diffuse into the silicon starved $TaSi_{0.6}$ portion 15 (of FIG. 8) and form $TaSi_2$ portion 91. The TaSiN remains the same as it is a stable compound that does not require any additional silicon atoms. As in the first exemplary implementation of the present invention, two metallic materials $TaSi_2$ and TaSiN are formed side-by-side and each metallic material possesses a different work function value where $TaSi_2$ is known to have work function of 4.8 eV, while TaSiN has a work function of 4.2 eV to 4.3 eV.

Figure 10:
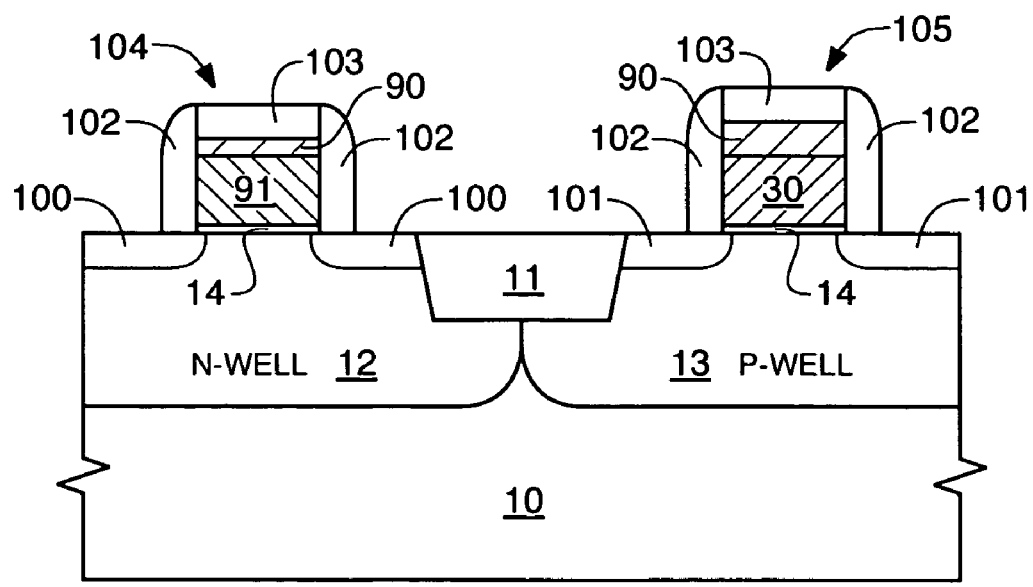
FIG. 10 is a subsequent cross-sectional view taken from FIG. 6 following the completion of a complementary transistor pair having transistor gates that possess differing work function values.

Referring now to FIG. 10, a complementary pair of completed transistor structures having dual work function gates is depicted. Both transistors are formed using conventional fabrication techniques to pattern and etch each transistor gate, followed by implanting the source and drain regions 100 with a p-type conductivity to form a p-channel transistor and implanting the source drain regions 101 with an n-type conductivity to form an n-channel transistor. Completed transistor gate 104 comprises insulation (such as nitride) spacers 102 and cap 103 that provide physical isolation for TaSi$_2$ gate 40. In like manner, completed transistor gate 105 comprises insulation (such as nitride) spacers 102 and cap 103 that provide physical isolation for TaSiN gate 30. The gate material for each transistor exhibits a differing work function as the TaSi$_2$ gate will have a work function of 4.8 eV, while TaSiN gate will have a work function of 4.2 eV to 4.3 eV.

Figure 11:
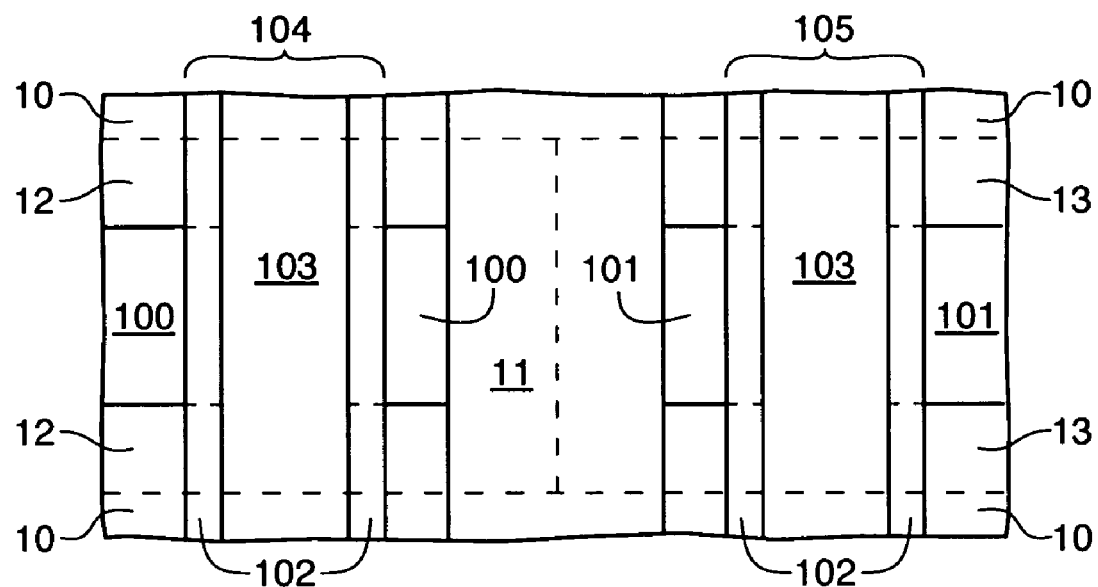
FIG. 11 is an overhead plan view of FIG. 10 showing a completed complementary transistor pair of a second embodiment of the present invention.

FIG. 11 depicts an overhead view of a completed complementary pair of transistor structures having dual work function gates as described in the process steps taken in FIG. 1-2 and 7-10. As shown in FIG. 11, substrate 10 has been implanted with conductive dopants to form NWell 11 and PWell 12. Completed transistor gate 104 comprises insulation spacers 102 and cap 103 that provide physical isolation for TaSi$_2$ gate 40 (not seen). In like manner, completed transistor gate 105 comprises insulation spacers 102 and insulation cap 103 that provide physical isolation for TaSiN gate 30 (not seen). The source and drain regions 100 are implanted with a p-type conductivity to form a p-channel transistor and the source drain regions 101 are implanted with an n-type conductivity to form an n-channel transistor.

Exemplary implementations of the present invention present two alternative methods of forming dual work function gates that allows the use of a gate annealing temperature that is well below the temperature at which nitrogen will begin denuding out of TaSiN, which is approximately 800° C. It is important to stay at an annealing temperature of around 800° C. or less as the nitrogen will significantly denude out of the TaSiN, thus altering the work function of the metallic material.

The exemplary embodiments have been discussed in reference to forming a complementary transistor pair for use in CMOS applications, such as memory devices. However, these concepts, taught in the exemplary embodiments, may be utilized by one of ordinary skill in the art to form complementary transistor pairs for use in most all CMOS applications. For example, the present invention may be applied to a semiconductor system, such as the one depicted in FIG. 12, the general operation of which is known to one skilled in the art.

Figure 12:
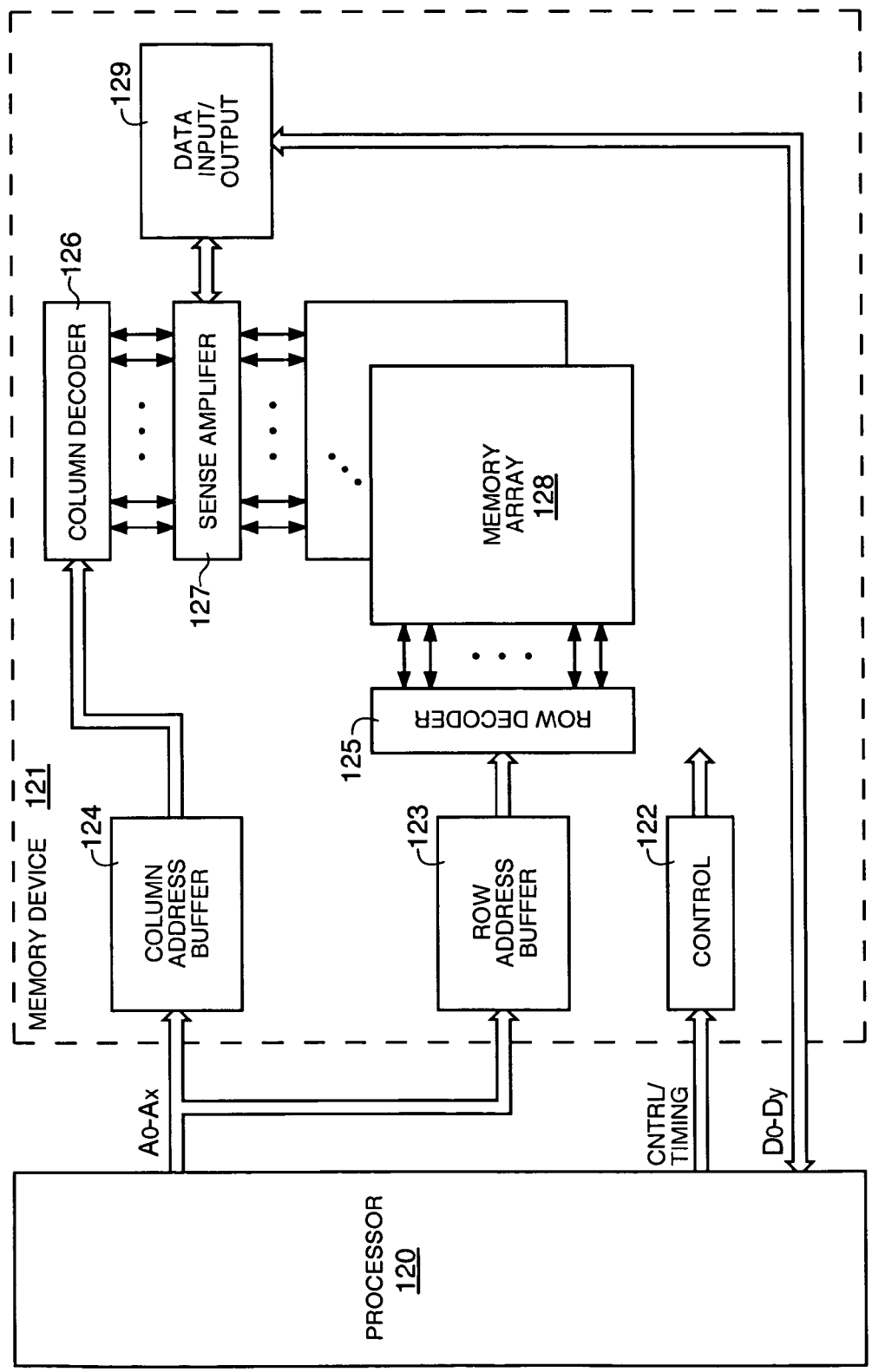
FIG. 12 is a simplified block diagram of a semiconductor system comprising a processor and memory device to which the present invention may be applied.

FIG. 12 represents a general block diagram of a semiconductor system comprising a processor 120 and a memory device 121 showing the basic sections of a memory integrated circuit, such as row and column address buffers, 123 and 124, row and column decoders, 125 and 126, sense amplifiers 127, memory array 128 and data input/output 129, which are manipulated by control/timing signals from the processor through control 122.

It is to be understood that, although the present invention has been described with reference to two exemplary embodiments, various modifications, known to those skilled in the art, may be made to the disclosed structure and process herein without departing from the invention as recited in the several claims appended hereto.

What is claimed is:

1. A method of forming complementary transistors on a semiconductor assembly comprising:

forming a metal silicon compound deficient of silicon bonding atoms on a dielectric material overlying a semiconductor substrate conductively doped for PMOS and NMOS regions;

converting the metal silicon compound overlying the NMOS region to a metal silicon nitride by introducing nitrogen ions thereto;

converting the metal silicon compound overlying the PMOS region to a metal silicide by introducing silicon ions thereto during annealing;

forming an NMOS transistor gate electrode comprising the metal silicon nitride; and forming a PMOS transistor gate electrode comprising the metal silicide.

2. The method of claim 1, wherein the metal silicon compound deficient of silicon bonding atoms is deposited by Physical Vapor Deposition (PVD), by Chemical Vapor Deposition (CVD), or by Atomic Layer Deposition (ALD).

3. The method of claim 1, wherein the metal silicon compound deficient of silicon bonding atoms is a film in the form of MSi$_x$, where M=Ta, Hf, Mo or W and x<2.

4. The method of claim 3, wherein the value of "x" is in the range of $0.4 \leq x \leq 1.0$.

5. The method of claim 1, wherein the metal silicon compound deficient of silicon bonding atoms is a TaSi$_x$ film.

6. The method of claim 5, wherein the TaSi$_x$ film is a TaSi$_{0.6}$ film.

7. The method of claim 1, wherein the metal silicide is tantalum disilicide (TaSi$_2$).

8. The method of claim 1, wherein the dielectric material comprises a dielectric constant of seven or greater.

9. The method of claim 1, wherein the dielectric material is a material selected from the group consisting essentially of Al$_2$O$_3$, SiO$_2$/Al$_2$O$_3$ and Al$_2$O$_3$HfO$_x$.

10. The method of claim 1, wherein the annealing is performed at a temperature range of about 550° C. to 800° C. for a time duration of about 20 seconds to 30 minutes.

11. The method of claim 1, wherein the annealing is performed at a temperature of approximately 600° C. for a time duration of approximately 30 seconds.

12. A method of forming complementary transistors on a semiconductor assembly comprising:

forming a metal silicon compound deficient of silicon bonding atoms on a dielectric material overlying a semiconductor substrate conductively doped for PMOS and NMOS regions;

converting the metal silicon compound overlying the NMOS region to a metal silicon nitride by introducing nitrogen ions thereto;

forming a silicon layer on the metal silicon nitride and the metal silicon compound overlying the PMOS region;

converting the metal silicon compound overlying the PMOS region to a metal silicide by annealing;

forming an NMOS transistor gate electrode comprising the metal silicon nitride; and forming a PMOS transistor gate electrode comprising the metal silicide.

13. The method of claim 12, wherein the metal silicon compound deficient of silicon bonding atoms is deposited by Physical Vapor Deposition (PVD) or by Chemical Vapor Deposition (CVD), or by Atomic Layer Deposition (ALD).

14. The method of claim 12, wherein the metal silicon compound deficient of silicon bonding atoms is a film in the form of MSi$_x$, where M=Ta, Hf, Mo or W and x<2.

15. The method of claim 14, wherein the value of "x" is in the range of $0.4 \leq x \leq 1.0$.

16. The method of claim 12, wherein the metal silicon compound deficient of silicon bonding atoms is a TaSi$_x$ film.

17. The method of claim 16, wherein the TaSi$_x$ film is a TaSi$_{0.6}$ film.

18. The method of claim 12, wherein the metal silicide is tantalum disilicide (TaSi$_2$).

19. The method of claim 12, wherein the dielectric material comprises a dielectric constant of seven or greater.

20. The method of claim 12, wherein the dielectric material is a material selected from the group consisting essentially of Al$_2$O$_3$, SiO$_2$/Al$_2$O$_3$ and Al$_2$O$_3$/HfO$_x$.

21. The method of claim 12, wherein the annealing is performed at a temperature range of about 550° C. to 800° C. for a time duration of about 20 seconds to 30 minutes.

22. The method of claim 12, wherein the annealing is performed at a temperature of approximately 650° C. for a time duration of approximately 30 seconds.

23. A method of forming a semiconductor memory device having complementary transistors comprising:
    forming a metal silicon compound deficient of silicon bonding atoms on a dielectric material overlying a semiconductor substrate conductively doped for PMOS and NMOS regions;
    converting the metal silicon compound overlying the NMOS region to a metal silicon nitride by introducing nitrogen ions thereto;
    converting the metal silicon compound overlying the PMOS region to a metal silicide by introducing silicon ions thereto during annealing;
    forming an NMOS transistor gate electrode comprising the metal silicon nitride; and
    forming a PMOS transistor gate electrode comprising the metal silicide.

24. The method of claim 23, wherein the metal silicon compound deficient of silicon bonding atoms is deposited by Physical Vapor Deposition (PVD), by Chemical Vapor Deposition (CVD), or by Atomic Layer Deposition (ALD).

25. The method of claim 23, wherein the metal silicon compound deficient of silicon bonding atoms is a film in the form of MSi$_x$, where M=Ta, Hf, Mo or W and x<2.

26. The method of claim 25, wherein the value of "x" is in the range of 0.4 ≦x≦1.0.

27. The method of claim 23, wherein the metal silicon compound deficient of silicon bonding atoms is a TaSi$_x$ film.

28. The method of claim 27, wherein the TaSi$_x$ film is a TaSi$_{0.6}$ film.

29. The method of claim 23, wherein the metal silicide is tantalum disilicide (TaSi$_2$).

30. The method of claim 23, wherein the dielectric material comprises a dielectric constant of seven or greater.

31. The method of claim 23, wherein the dielectric material is a material selected from the group consisting essentially of Al$_2$O$_3$, SiO$_2$Al$_2$O$_3$ and Al$_2$O$_3$HfO$_x$.

32. The method of claim 23, wherein the annealing is performed at a temperature range of about 550° C. to 800° C. for a time duration of about 20 seconds to 30 minutes.

33. The method of claim 23, wherein the annealing is performed at a temperature of approximately 600° C. for a time duration of approximately 30 seconds.

34. A method of forming a semiconductor memory device having complementary transistors comprising:
    forming a metal silicon compound deficient of silicon bonding atoms on a dielectric material overlying a semiconductor substrate conductively doped for PMOS and NMOS regions;
    converting the metal silicon compound overlying the NMOS region to a metal silicon nitride by introducing nitrogen ions thereto;
    forming a silicon layer on the metal silicon nitride and the metal silicon compound overlying the PMOS region;
    converting the metal silicon compound overlying the PMOS region to a metal silicide by annealing;
    forming an NMOS transistor gate electrode comprising the metal silicon nitride; and
    forming a PMOS transistor gate electrode comprising the metal silicide.

35. The method of claim 34, wherein the metal silicon compound deficient of silicon bonding atoms is deposited by Physical Vapor Deposition (PVD) or by Chemical Vapor Deposition (CVD), or by Atomic Layer Deposition (ALD).

36. The method of claim 34, wherein the metal silicon compound deficient of silicon bonding atoms is a film in the form of MSi$_x$, where M=Ta, Hf, Mo or W and x<2.

37. The method of claim 36, wherein the value of "x" is in the range of 0.4≦x≦1.0.

38. The method of claim 36, wherein the metal silicon compound deficient of silicon bonding atoms is a TaSi$_x$ film.

39. The method of claim 38, wherein the TaSi$_x$ film is a TaSi$_{0.6}$ film.

40. The method of claim 34, wherein the metal silicide is tantalum disilicide (TaSi$_2$).

41. The method of claim 34, wherein the dielectric material comprises a dielectric constant of seven or greater.

42. The method of claim 34, wherein the dielectric material is a material selected from the group consisting essentially of Al$_2$O$_3$, SiO$_2$Al$_2$O$_3$ and Al$_2$O$_3$/HfO$_x$.

43. The method of claim 34, wherein the annealing is performed at a temperature range of about 550° C. to 800° C. for a time duration of about 20 seconds to 30 minutes.

44. The method of claim 34, wherein the annealing is performed at a temperature of approximately 650° C. for a time duration of approximately 30 seconds.

45. A method of forming a semiconductor memory device having complementary transistors comprising:
    forming a TaSi$_{0.6}$ film on a dielectric material overlying a semiconductor substrate conductively doped for PMOS and NMOS regions;
    converting the TaSi$_{0.6}$ film overlying the NMOS region to tantalum nitride by introducing nitrogen ions thereto;
    converting the TaSi$_{0.6}$ film overlying the PMOS region to tantalum disilicide by introducing silicon ions thereto during annealing;
    forming an NMOS transistor gate electrode comprising the tantalum silicon nitride; and
    forming a PMOS transistor gate electrode comprising the tantalum disilicide.

46. The method of claim 45, wherein the TaSi$_{0.6}$ film is deposited by Physical Vapor Deposition (PVD), by Chemical Vapor Deposition (CVD), or by Atomic Layer Deposition (ALD).

47. The method of claim 45, wherein the dielectric material comprises a dielectric constant of seven or greater.

48. The method of claim 45, wherein the dielectric material is a material selected from the group consisting essentially of Al$_2$O$_3$, SiO$_2$Al$_2$O$_3$ and Al$_2$O$_3$HfO$_x$.

49. The method of claim 45, wherein the annealing is performed at a temperature range of about 550° C. to 800° C. for a time duration of about 20 seconds to 30 minutes.

50. The method of claim 45, wherein the annealing is performed at a temperature of approximately 600° C. for a time duration of approximately 30 seconds.

51. A method of forming a semiconductor memory device having complementary transistors comprising:
  forming a $TaSi_{0.6}$ film on a dielectric material overlying a semiconductor substrate conductively doped for PMOS and NMOS regions;
  converting the $TaSi_{0.6}$ film overlying the NMOS region to a metal silicon nitride by introducing nitrogen ions thereto;
  forming a silicon layer on the tantalum silicon nitride and the $TaSi_{0.6}$ film overlying the PMOS region;
  converting the $TaSi_{0.6}$ film overlying the PMOS region to a tantalum disilicide by annealing;
  forming an NMOS transistor gate electrode comprising the tantalum silicon nitride; and
  forming a PMOS transistor gate electrode comprising the tantalum disilicide.

52. The method of claim 51, wherein the tantalum is deposited by Physical Vapor Deposition (PVD) or by Chemical Vapor Deposition (CVD), or by Atomic Layer Deposition (ALD).

53. The method of claim 51, wherein the dielectric material comprises a dielectric constant of seven or greater.

54. The method of claim 51, wherein the dielectric material is a material selected from the group consisting essentially of $Al_2O_3$, $SiO_2/Al_2O_3$ and $Al_2O_3/HfO_x$.

55. The method of claim 51, wherein the annealing is performed at a temperature range of about 550° C. to 800° C. for a time duration of about 20 seconds to 30 minutes.

56. The method of claim 51, wherein the annealing is performed at a temperature of approximately 650° C. for a time duration of approximately 30 seconds.

* * * * *